United States Patent [19]
Darling, Jr.

[11] Patent Number: 5,141,595
[45] Date of Patent: Aug. 25, 1992

[54] METHOD AND APPARATUS FOR CARBON COATING AND BORON-DOPED CARBON COATING

[75] Inventor: Phillip H. Darling, Jr., Buena Park, Calif.

[73] Assignee: Northrop Corporation, Hawthorne, Calif.

[21] Appl. No.: 490,002

[22] Filed: Mar. 5, 1990

[51] Int. Cl.⁵ ............................... C30B 25/00
[52] U.S. Cl. ........................ 156/610; 156/601; 156/611; 156/612; 156/613; 156/614; 156/DIG. 73; 156/DIG. 86; 156/DIG. 88
[58] Field of Search .......... 156/601, 610, 611, 612, 156/613, 614, DIG. 73, DIG. 86, DIG. 88

[56] References Cited

U.S. PATENT DOCUMENTS

| | | | |
|---|---|---|---|
| 3,328,199 | 6/1967 | Sirth | 156/613 |
| 3,386,866 | 6/1968 | Ebert et al. | 156/613 |
| 3,520,740 | 7/1970 | Addamiano | 156/614 |
| 3,635,757 | 1/1972 | Harris | 156/612 |
| 3,930,908 | 1/1976 | Jolly | 156/610 |
| 4,190,470 | 2/1980 | Walline | 156/611 |
| 4,341,588 | 7/1982 | Sterling | 156/601 |
| 4,722,911 | 2/1988 | Frijlink | 156/611 |

FOREIGN PATENT DOCUMENTS 1487973 6/1989 U.S.S.R. ............... 156/601

Primary Examiner—Robert Kunemund
Assistant Examiner—Felisa Garrett
Attorney, Agent, or Firm—Terry J. Anderson; Robert B. Block; Karl J. Hoch, Jr.

[57] ABSTRACT

The disclosed invention employs a gravity assisted open system for coating of refractory substrates with a highly uniform layer of graphite or other material. Pyrolytic dissociation of precursor gases in an inert atmosphere flowing downwardly, countercurrent to the upward direction of transport of the substrate material, promotes condensation of the coating material on the moving substrate in a homogenous coating. The open configuration of the system allows continuous feed and takeup of substrate material to reduce startup and shutdown transient conditions affecting uniformity of the coating.

17 Claims, 4 Drawing Sheets

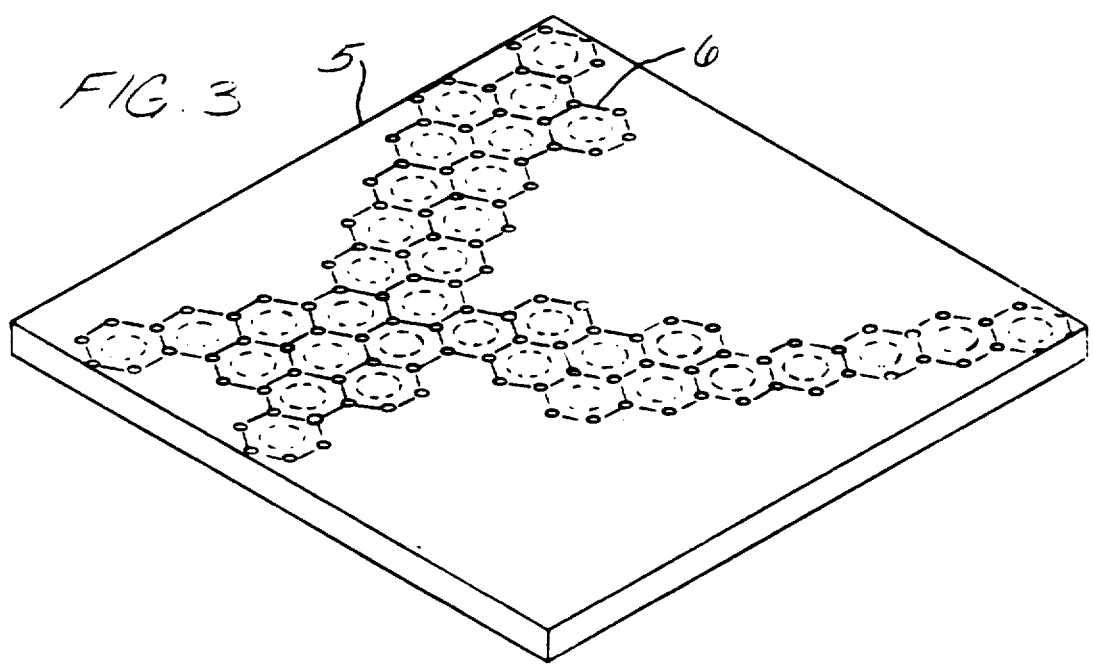

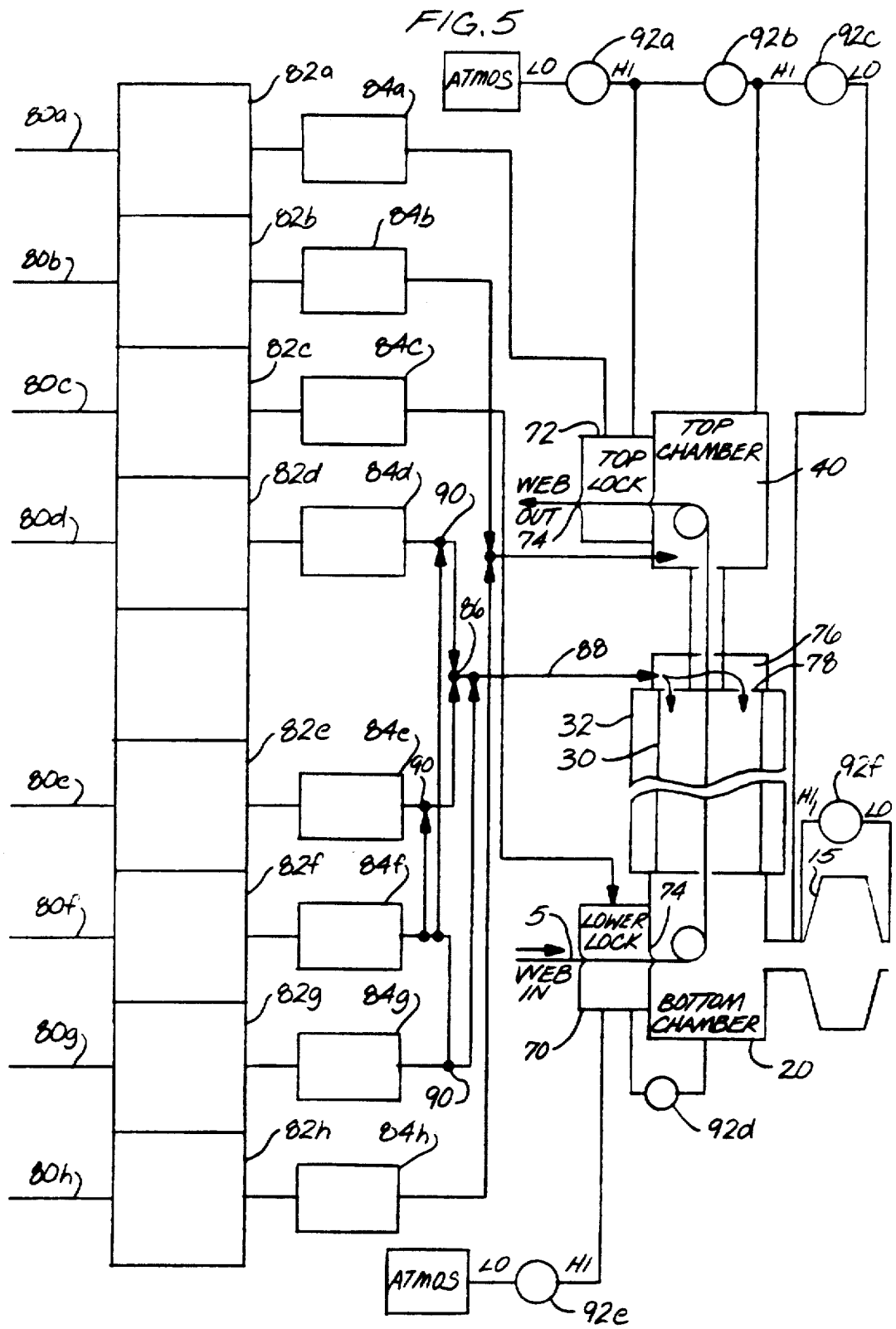

METHOD AND APPARATUS FOR CARBON COATING AND BORON-DOPED CARBON COATING

FIELD OF THE INVENTION

This invention relates to an apparatus and process for carbon-coating a substrate, and, more particularly, entails a continuous process for doping to enhance the semiconductor properties of the carbon coating in an open system.

BACKGROUND OF THE INVENTION

Processes for carbon-coating a substrate are known and are taught, for example, in U.S. Pat. No. 3,428,519 to Zvanut. Zvanut discloses a process for thermoplastic fiber generation and carbon-coating under atmospheric pressure in an oxygen-rich, closed system.

A second example of Boron-doped carbon-coating is taught in U.S. Pat. No. 3,565,683 to Morelock. Morelock discloses a continuous process for depositing a borocarbon coating on an electrically heated surface of a pyrolytic carbon-coated fused silica fiber as it is passed through a liquid, thermally decomposable boron compound.

U.S. Pat. No. 4,722,860 to Doljack et al. discloses a method for forming a flexible carbon-coated, electrically conductive cloth. An organic compound is pyrolytically coated onto a refractory, fibrous cloth under an inert atmosphere, in a closed system. The use of a vacuum is disclosed as a means for mobilizing organic precursor compounds.

The prior art does not teach or suggest a continuous throughput process for carbon-coating a substrate in an open system, at atmospheric pressure. In particular, an open-system process for semiconductor-doped carbon-coating, under an inert atmosphere, in which the coating occurs by chemical vapor deposition, has not previously been disclosed.

SUMMARY OF THE INVENTION

In accordance with an embodiment of the present invention an apparatus and process for continuous high temperature carbon-coating at atmospheric pressure in an open system is provided. The process comprises passing the substrate to be coated upwardly through a heated, air-free, inert gas-flushed reaction chamber that is open to the atmosphere at the bottom; and introducing a carbon containing precursor gas at the top of the reaction chamber, such that the gas flows in a downward direction, counter-current to the moving substrate; wherein the carbon containing precursor gas thermally dissociates and the carbon therefrom then condenses on the substrate as graphite. The coated material may be wound up and stored inside a chamber just above the reaction chamber. Alternatively, endless transport of material through the reaction chamber is provided by opening the top of the reaction chamber and providing an inert gas blanket with slight positive pressure. Thus, the coated substrate may be removed without introducing air into the reaction chamber.

In accordance with another embodiment of the present invention a semiconducting material such as boron trichloride, is introduced as a gas at the top of the aforementioned reaction chamber. The semiconducting material is then thermally dissociated along with the carbon precursor gas and condenses on the moving substrate. The result is a semiconductor-doped, carbon-coated substrate having particular electrical, magnetic, and optical properties.

BRIEF DESCRIPTION OF THE DRAWINGS

FIG. 3 is a schematic view of a graphitic superstrate deposited on a substrate by the process of the present invention.

FIG. 5 is a schematic diagram of an embodiment of the system for pilot production.

DETAILED DESCRIPTION OF THE INVENTION

In accordance with the present invention, a process and apparatus for the continuous chemical vapor deposition of a superstrate onto a substrate is provided. In particular, the process allows a substrate to be coated with a graphitic material, thus affording an electrically conductive, carbon-coated product.

Figure 1:
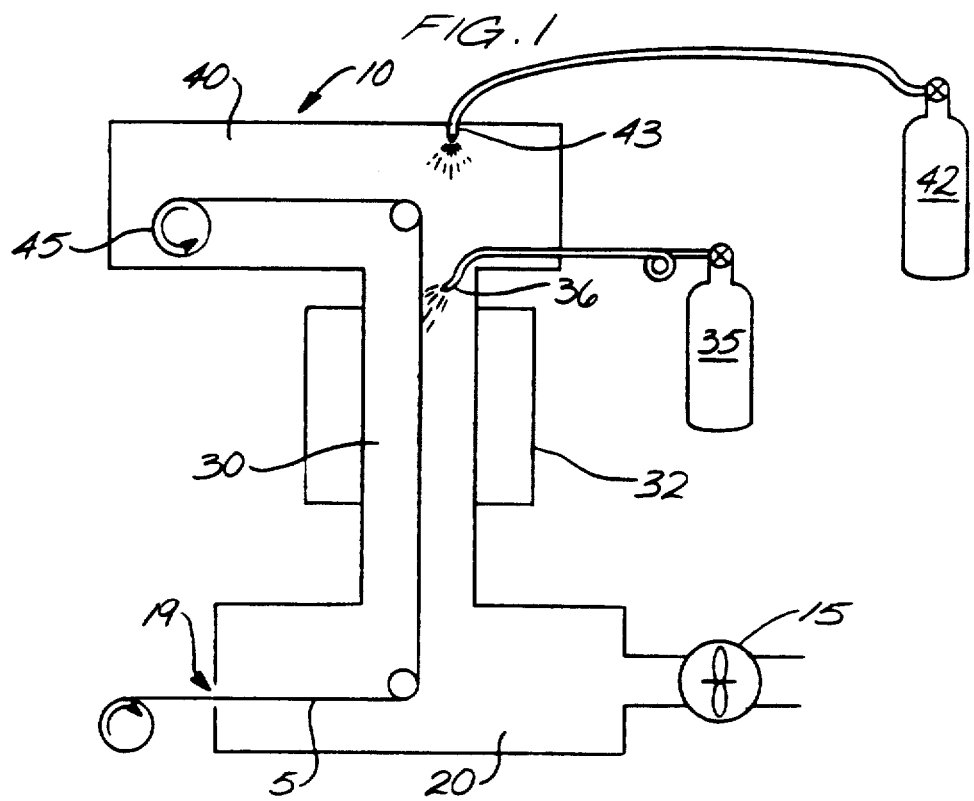
FIG. 1 is a schematic illustration of a process in accordance with one embodiment of the present invention.

FIG. 1 shows one embodiment of the present invention. A substrate material 5 to be coated is introduced through an inlet 19 of a lower chamber 20 of a process plant 10. The essential characteristic of the substrate is that it be able to survive the elevated temperature of the reaction chamber 30, typically 700°-900° C. Suitable substrates include refractory fibers and cloths composed of such fibers. A description of acceptable refractory materials is found in U.S. Pat. No. 4,722,860 to Doljack et al., which is incorporated herein by reference.

The material to be coated is directed into a heated, essentially oxygen-free reaction chamber 30, where chemical vapor deposition occurs. The chamber is heated by an oven 32. It is necessary to purge all oxygen from the reaction chamber 30 in order to avoid oxidation of the precursor gases 35. This is accomplished by flushing the process plant 10 with an inert gas, such as argon or nitrogen, prior to the actual chemical vapor deposition.

In the particular apparatus shown in FIG. 1, the coating process occurs within an "open" process plant 10 comprising three chambers: a lower chamber 20, a heated reaction chamber 30, and an upper chamber 40. The interior of all three chambers, but especially the reaction chamber and the lower chamber, are preferably constructed of a strong, corrosion-resistant material. Presently, a thick-walled quartz tube is used as the reaction chamber. Anti-corrosive properties are required because highly reactive molecular, atomic, and ionic species are generated during the coating process. Some of the species can destructively interact with exposed surfaces within the apparatus, potentially resulting in a loss of structural integrity. The substrate 5 is introduced into the lower chamber 20 through an inlet 19 that is open to the surrounding atmosphere. The substrate is moved up through the reaction chamber, 30 which contains a chemical vapor deposition zone 31, wherein the substrate is coated with a superstrate. The coated substrate then passes into an upper chamber 40, where it is stored on a spool 45 or other appropriate take up means.

A prototype process plant has been designed to accommodate a substrate that is about four inches wide. Thus, both the width of the inlet 19 in the lower chamber 20, and the diameter of the quartz tube comprising the reaction chamber 30 are slightly larger than four inches. An example of a larger system for preliminary batch production on a larger scale will be described in greater detail subsequently. Those skilled in the art will recognize the scaling of the systems described for commercial application.

The substrate employed for prototype operations was Nextel 312 fiber having 62% aluminum oxide ($Al_2O_3$), 14% boron oxide ($B_2O_3$), 24% silicon dioxide ($SiO_2$) by weight. The fibers were woven in to a fabric of 300 denier, 5 harness satin weave, 60×60 yarns/inch.

The oven 32 preferably encompasses the entire reaction chamber, and therefore provides a thermally uniform environment within the chemical vapor deposition zone. The preferred oven operates by electrical resistivity heating and is exemplified by the 54000 series single-zone tube furnaces produced by Lindberg, 304 Hart Street Watertown, Wis. used in the prototype.

Chemical vapor deposition is accomplished by introducing a precursor gas 35 into the top of the reaction chamber through a nozzle 36. As indicated in the drawings, the reaction chamber is vertically oriented, and thus, the gravity gradient operates from top to bottom. In addition pressure in the upper chamber 40 is elevated relative to the lower chamber 20 due to the introduction of the precursor gas 35. Accordingly, the molecules comprising the precursor gas travel in a generally downward direction, counter-current to the moving substrate. As long as either a process gas or an inert gas is introduced at the top of the reaction chamber, no air is introduced into the system through the lower chamber inlet 19. Thus, the system is "open" and is operated at substantially atmospheric pressure.

As the precursor gas moves down the heated reaction chamber, the gas is thermally dissociated into various species, such as individual atoms and molecular fragments. These species collide with and condense on the upwardly moving substrate 5, forming a superstrate coating, which is more fully described subsequently.

As discussed above, the process plant is first purged of oxygen by flushing the plant with an inert gas 42 such as argon or nitrogen. Additionally, during the coating process, a constant flow of inert gas of about 1 l/min is preferably provided at the top of the upper chamber. The gas is introduced into the upper chamber through a nozzle 43. This facilitates the even distribution of the precursor gas or gases throughout the chemical vapor deposition zone. Both precursor and inert gas flow rates may be maintained by conventional regulator means. In an alternate embodiment described below, a feedback control system is employed to monitor and control the coating process, and includes electronic control of the precursor gas flow rate.

Within the reaction chamber 30, individual precursor gas molecules are heated and thermolytically dissociated into a number of molecular, atomic and ionic species. The nature of the actual species produced depends upon a number of factors, including the temperature of the reaction chamber, and the flow rate of the precursor gas.

When dissociated species collide with the moving substrate, they lose energy and condense on the surface of the substrate. The result is a superstrate-coated substrate.

The process is particularly suitable for carbon-coating a substrate to produce an electrically conductive material. To this end, the process employs a hydrocarbon as the precursor gas. Isobutylene is a preferred hydrocarbon.

When isobutylene is thermally dissociated, the species that are produced include hydrogen atoms and hydrocarbon radicals. As shown schematically in FIG. 3, it is thought that when the hydrocarbon radicals condense, and "stick" to the substrate 5, hexagonal "graphite-like" arrays 6 are formed. The result is an electrically conductive superstrate, or graphite coating. Micrographic analysis of substrates coated using the process and apparatus of the invention show a highly uniform, tenaciously bonded coating.

It has been discovered that the present invention is also useful as a process for boro-carbon coating a substrate. Specifically, by introducing both hydrocarbon and boron-containing gases into the reaction chamber, a superstrate that comprises boron-doped carbon arrays is formed on the substrate. The electrical properties of the coated substrate can be "fine tuned" by adjusting the hydrocarbon:boron ratio of the precursor gases. Specifically, a substrate can be coated such that the resulting product has a controllable sheet resistance along its length and a substantially uniform sheet resistance along its breadth. The feedback control system described below provides the means for such fine tuning.

Presently, it is preferred to use a blend of isobutylene and boron trichloride as the precursor gas. Because of the similar bond enthalpies of B—Cl bonds in $BC_3$, and C—C bonds in isobutylene, a reaction chamber temperature of from about 700° C. to about 900° C. is sufficient to yield effective thermal dissociation of both boron trichloride and isobutylene. A boro-carbon coating produced in this manner has a markedly lower electrical resistance than a coating that is not boron-doped.

It will be understood by those skilled in the art that the present invention has additional applications. For example, the process can be utilized to coat a substrate with other materials. Because the process entails chemical vapor deposition, correlation between precursor gas bond strengths and reaction chamber temperature is required.

Figure 2:
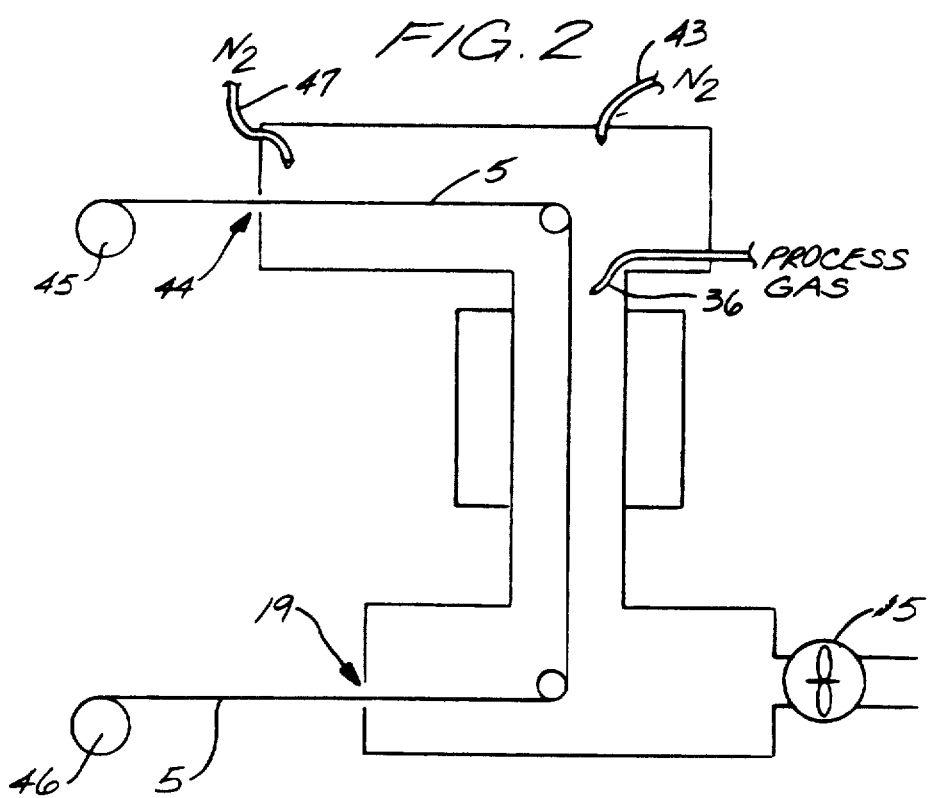
FIG. 2 is a schematic illustration of a process in accordance with an alternate embodiment of the present invention.

The process has been described as embodying a vertically oriented system that is open at the bottom. In an alternate embodiment, the coating process is operated in a plant that is open both above and below the reaction chamber. This embodiment is schematically shown in FIG. 2.

The upper chamber 40 now contains an outlet 44, through which the coated substrate passes as it leaves the process plant. The take-up means 45 and playout means 46 are externally located in this embodiment. An additional blanket of inert gas is provided in the upper chamber through inlet 47, with gas flow directed toward the outlet 44, so that the introduction of air into the upper chamber is prevented.

When the coating process is operated in this doubly open process plant, the benefit of endless throughput of material is realized.

The process as described above can be modified to include exhaust means for removing by-products of the thermal dissociation and coating steps. The process plant depicted in FIGS. 1 and 2 includes exhaust means 15 attached to the lower chamber 20. The inflow of the precursor and inert gases is balanced against the exhaust means such that the reaction chamber is filled with gas, moving downward, and such that air cannot enter the reaction chamber. Thus, the exhaust means is adjusted to just remove reaction by-products, and the coating process operates at, or slightly above, atmospheric pressure.

In a modification of the invention described above, the coating process is monitored and controlled by a feedback control system. Essentially, the system comprises periodically measuring a physical property (or properties) of the coated substrate, and using the resulting measurements to control the chemical vapor deposition process so as to produce a coated substrate having desirable, and preferably uniform, properties.

Figure 4A:
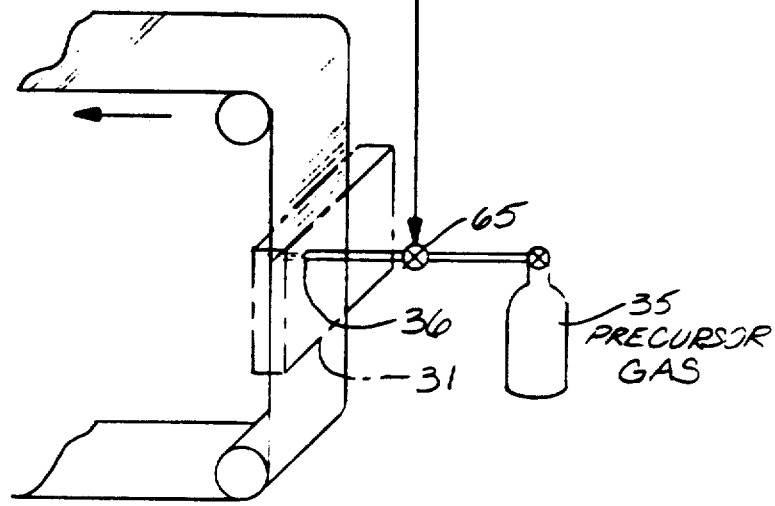
FIGS. 4A and 4B are schematic diagram of a feedback control system used in one embodiment of the invention.
Figure 4B:
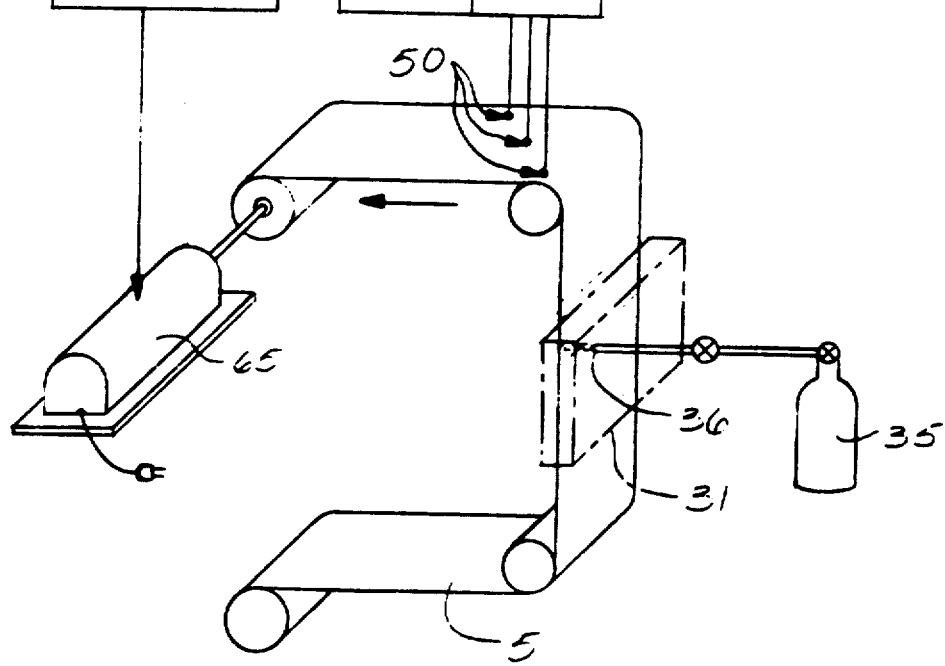

Schematic diagrams are shown in FIGS. 4A and 4B. After the moving substrate is coated with a superstrate in the chemical vapor deposition zone, a physical property of the coated substrate is measured by measuring means comprising pick-ups 50 and a meter 55. The property may be electrical (e.g. resistivity, conductivity, etc.), magnetic (e.g. magnetic susceptibility), or optical (e.g. optical density, refractive index, etc.). A combination of properties may be measured.

A transducer 56 attached to the meter converts the measured value into an electrical (or optical) signal which is input into electronic control means 60. The electronic control means is connected for physically altering a parameter such as substrate transport velocity, precursor gas flow rate, oven temperature or combinations thereof. In the preferred embodiment shown in FIG. 4B, the means for altering the parameter comprises a motor 65 that powers the transport of the substrate through the reaction chamber. When the feedback mechanism operates by regulating substrate transport velocity, very rapid adjustment of the coated substrate's properties is achieved.

Alternatively, the means for altering the parameters may comprise a valve that regulates precursor gas flow rate as shown in FIG. 4A, or a thermostat that regulates oven temperature. A combination of the means for altering the parameters described previously may be employed.

The value of a given property of the coated substrate depends upon the physico-chemical make-up of the superstrate coating. Altering the conditions within the chemical vapor deposition zone by adjusting a parameter such as substrate transport velocity, flow rate or oven temperature results in a modification of the properties of the coated substrate. Thus, the described feedback mechanism provides a means for maintaining the value of superstrate properties within desirable tolerances.

FIG. 5 schematically shows a scale-up pilot production version of the present invention which has been fabricated and tested. The basic elements of the system including the bottom chamber 20, reaction chamber 30, oven 32 and upper chamber 40 remain as previously described. To enhance the "open" system nature of the invention, a lower lock 70 and an upper lock 72 have been added to the lower and upper chambers respectively. A positive pressure of inert gas is maintained in both locks to prevent air intrusion into the system. Wipers 74 allow the substrate web to enter and exit the lock without significant loss of pressure in the lock. The wipers may be fabricated from flexible rubber, teflon or other material not degraded by the process gases. A process gas inlet plenum 76 has been added between the top chamber and the reaction chamber to evenly distribute the entry of the process gas into the reaction chamber. Perforations in the interface 78 between the plenum and the reaction chamber allow gas to migrate into the reaction chamber. The plenum provides even distribution of the gas to both sides of the web to promote even coating of the substrate.

Control of gas flow rates in the system is accomplished by use of a Dynamass controller produced by Vacuum General Corporation. The Dynamass controller measures the mass flow rate of the gas measured and adjusts the flow rate to a desired value by way of a control valve. In the embodiment shown in FIG. 5, the inert gas blanket for the top lock (preferably argon or nitrogen) enters the Dynamass flowmeter on line 80a and is processed through the first channel of the Dynamass system 82a and control valve 84a to the top lock. A flow rate of 0 to 10,000 milliliters per minute is provided as will be described subsequently. Similarly the top chamber inert blanket is provided on line 80b through channel 82b of the Dynamass system and valve 84b. A flow rate of 0 to 10,000 milliliters per minute for the top chamber inert blanket is provided. The lower lock inert blanket is provided on input 80c through channel 82c of the Dynamass system and flow control valve 84c. 0 to 10,000 milliliters per minute of inert gas flow is provided. The basic process gas is provided on input 80d through the fourth channel 82d of the Dynamass system and flow control valve 84d. Flow capability of 0 to 10,000 milliliters per minute is provided. The doping process gas is provided on input 80e through channel 82e of the Dynamass system and flow control valve 84e. A flow rate of 0 to 1,000 milliliters per minute of the doping process gas is provided. The basic process gas and doping process gas are combined at node 86 to be introduced to the process gas inlet plenum through line 88. An inert purge is provided on line 80f through channel 82f of the Dynamass system and flow control valve 84f. The inert purged gas is provided at a set value of 4,000 milliliters per minute when activated as described subsequently. The inert purge is provided through connections 90 into each of the process gas lines and the air cooling line which will be subsequently described to allow purging and inerting of those lines. Cooling air is provided on input 80g through channel 82g of the Dynamass system and flow control valve 84g. Cooling air flow rate of 0 to 10,000 milliliters per minute is provided. Finally, a top chamber inert blanket booster of 0 to 10,000 milliliters per minute is provided on input 80h through channel 82h of the Dynamass system and flow control valve 84h to the top chamber. Those skilled in the art will recognize that the top chamber inert blanket and booster provided through channels 82b and 82h could be combined into a single channel with proper control sensitivity to provide desired flow rates.

Control of the speed of the substrate web through the system is provided by a motor control as previously described with respect to FIG. 4b.

Differential pressure indicators 92a through f are provided to sense the differential pressure between the top lock and atmospheric pressure (92a), the top lock and top chamber (92b), the top chamber and bottom chamber (92c), the bottom chamber and lower lock (92d), between the lower lock and atmospheric pressure (92e), and between the bottom chamber and outlet of the exhaust fan 15 (92f).

Operation of the system is accomplished in six basic sequences. An initial start cycle to turn the oven heaters on and purge the entire system with the inert purge gas initiates the process. A blanket sequence to stabilize the blanket pressures in the locks and top and bottom chambers is then completed. The system is allowed to stabilize for approximately 60 minutes prior to initiation of the process gas sequence which introduces the basic process gas and doping process gas into the reaction chamber. The system is again allowed to stabilize for approximately 60 minutes and a run start sequence is then employed to verify the temperatures in the reaction chamber and turn the web drive on causing the substrate to translate through the reaction chamber. The system is again allowed to stabilize for approximately 20 minutes at which time control of the speed of translation through the reaction chamber is initiated in a resistance bias speed control sequence. The system then operates to coat the substrate transitioning through the reaction chamber. If any of the process parameters are out of tolerance or if the coating operation is complete, a stop cycle is entered to deactivate the oven, stop flow of the process gases, and initiate a purge of the system. After purge of approximately 20 minutes is complete, cooling air is provided to cool down the reaction chamber.

Details of the process sequence previously described are shown in Table 1 and may be incorporated through a computer control system appropriately interfaced with the differential pressure indicators, Dynamass flow control system and the flow control valves. Pressure designations in Table 1 are P1 for atmospheric pressure, P2 for the pressure in the top lock, P3 for the pressure in the top chamber, P4 for the pressure in the bottom chamber, P5 for the pressure in the lower lock, and P6 for the pressure at the outlet of the exhaust fan.

TABLE 1

| | | ACTION/OBSERVATION | SETTING/VALUE | START TIME (MIN.) | DURATION |
|---|---|---|---|---|---|
| START CYCLE 1 | | | | | |
| STEP | 1.1 | Turn heater ON | 600–900° C. NOMINAL 0–1200° C. RANGE | 0 | CONTINUOUS |
| STEP | 1.2 | Turn purge gas ON (84f) | 4,000 ml/min nominal 0–10,000 ml/min. range | 0 | 60 min. |
| BLANKET SEQUENCE 1.3 | | | | | |
| STEP | 1.3.1 | Turn top chamber blanket gas ON (84b) | 9,000 ml/min nominal 0–10,000 ml/min | 0 | Cont. |
| | 1.3.2 | Turn fan ON under control of differential pressure (92c) BASIC P3 > P4 | +0.02 NOMINAL +0.01 to 0.04 in H2O | 1.0 | Cont. |
| | 1.3.3 | Turn top lock blanket gas (V1) ON under control of DP gage (92a) P2 > P1, P3 > P2 | 0–10,000 ml/min. +0.01 to 0.02 in H2O | 1.5 | Cont. |
| | 1.3.4 | Turn lower lock blanket gas (84c) ON under control of DP page (92e) P5 > P1, P5 > P4 | 0–10,000 ml/min. +0.01 to 0.02 in H2O | 1.5 | Cont. |
| | 1.3.5 | Check DP relationships P3 > P4 P2 > P1 P5 > P1 P5 > P4 | +0.02 in H2O BASIC +0.01–0.02 in H2O +0.01–0.02 in H2O +0.01–0.02 in H2O | 2. | |
| If NO with 84h OFF, go to 1.3.6. If NO with 84h ON, go to 1.3.7. If YES, go to 1.4 at 60 minutes. | | | | | |
| | 1.3.6 | If P3 ≤ P4 turn top chamber booster blanket gas ON (84h) Go to 1.3.5 | 0–10,000 ml/min. | 2.5 | |
| | 1.3.7 | Turn heater OFF | | 3. | |
| | 1.3.8 | Turn all gas OFF | | 3. | |
| | 1.3.9 | Sound alarm | | 3. | |
| PROCESS GAS SEQUENCE 1.4 | | | | 60 | |
| | 1.4.1 | Heaters remain ON | | 60 | |
| | 1.4.2 | Turn purge gas OFF (84f) | | 60 | |
| | 1.4.3 | Turn process gas 1 ON (82d) ISOBUTYLENE | 0–10,000 ml/min. set value | 60 | |
| | 1.4.4 | Turn process gas 2 ON (84e) BORON TRICHLORIDE | 0–1,000 ml/min. set value | 60 | |
| | 1.4.5 | Resistance high. | | 60 | |

TABLE 1-continued

| | ACTION/OBSERVATION | SETTING/VALUE | START TIME (MIN.) | DURATION |
|---|---|---|---|---|
| | Resistance bias OFF (condition status) | | | |
| 1.4.6 | Web drive OFF (condition status) | | 60 | |
| RUN START SEQUENCE 1.5 | | | | |
| 1.5.1 | Is Temp. at set point If YES, go to 1.5.2. If No, repeat 1.5.1. | | 120 min. minimum | |
| 1.5.2 | Turn web drive ON at nominal speed | 6 inches/min. | 120 min. | |
| RESISTANCE BIAS SPEED CONTROL 1.6 | | | | |
| 1.6.1 | Resistance of web in range | ±10% of resistance in ohms/square 1-10 KOHM/SQ. | 140 | |
| 1.6.2 | Turn web drive resistance bias ON | +.0000 VCD to +0.2000 VDC inversely prop. to Res. | 140 | |
| STOP CYCLE 2 | | | 0 min. of stop cycle | |
| 2.1 | Is Resistance of web out of range? If YES, go to 2.7. | | 0 | |
| 2.2 | Is web drive motor torque too high or low? If YES, go to 2.7. | | 0 | |
| 2.3 | Are blanket gas relationships of 1.3.5 wrong? If YES, go to 2.7. | | 0 | |
| 2.4 | Are process gas flows of 1.4.3 and 1.4.4 wrong? If YES, go to 2.7. | | 0 | |
| 2.5 | Are set point temperatures of 1.5.1 wrong? If YES, go to 2.7. | | 0 | |
| 2.6 | Has operator initiated STOP CYCLE? If YES, go to 2.7. | | 0 min of STOP CYCLE | |
| 2.7 | Turn heaters OFF | | 0 | |
| 2.8 | Turn process gas 1 OFF (82d) | | 0 | |
| 2.9 | Turn process gas 2 OFF (84e) | | 0 | |
| 2.10 | Turn purge gas ON (84f) | 4,000 ml/min. | 0 | |
| 2.11 | Turn web drive OFF, return to operator control | | 0 | |
| 2.12 | Turn resistance bias OFF | | 0 | |
| 2.13 | Turn Air ON (84g) | 0–10,000 ml/min. | 20 | 120 min. 0–120 min. |

The invention has been described in exemplary and preferred embodiments, but it is not limited thereto. Those skilled in the art will recognize that a number of additional modifications and improvement can be made to the invention without departure from the essential spirit and scope. Therefore, the invention is not limited by the above disclosure, but only by the following claims.

What is claimed is:

1. A process for continuous chemical vapor deposition of a superstrate onto a substrate, comprising:
continuously moving the substrate, leading end followed by trailing end in a generally vertical direction, along a substrate path through a lower chamber open to atmospheric pressure and having an inlet aperture for introducing the substrate, and then through a generally vertically oriented reaction chamber mounted atop and extending upwardly form the lower chamber, and then into an upper chamber mounted atop and extending upwardly away from the reaction chamber, and finally onto a storage roll, the substrate comprising a fibrous refractory material;

introducing a first precursor gas into the reaction chamber and directing the first precursor gas evenly toward the substrate in a first direction generally opposite to the movement of the substrate along the substrate path; and, heating the reaction chamber to a temperature sufficient to pyrolytically dissociate the first precursor gas into a plurality of first species such as individual atoms and molecular fragments, certain of the first species colliding with and evenly condensing upon surfaces of the substrate as the substrate is moved through the reaction chamber to form a superstrate coating thereon.

2. A process for continuous chemical vapor deposition as claimed in claim 1, further comprising:

introducing a second precursor gas into the reaction chamber and directing the second precursor gas evenly toward the substrate in a second direction generally opposite to the movement of the substrate along the substrate path, the temperature of the reaction chamber begin selected to pyrolytically dissociate both the first and second precursor gases, the second precursor gas dissociating into various second species such as individual atoms and molecular fragments, certain of the second species colliding with and condensing on the surfaces of the substrate with the condensing certain of the first species as the substrate is moved through the reaction chamber to form a superstrate coating thereon.

3. A process as claimed in claim 1, further comprising introducing an inert gas into the upper chamber, the inert gas flowing downwardly from the upper chamber through the reaction chamber and into the lower chamber, a flow rate of the inert gas being selected to preclude entry of air into the upper chamber, the reaction chamber and the lower chamber.

4. A process as claimed in claim 3, wherein the inert gas comprises nitrogen.

5. A process as claimed in claim 3, wherein the inert gas comprises argon.

6. A process as claimed in claim 1, wherein an oven encompasses the reaction chamber, operation of the oven producing thermally uniform conditions within the reaction chamber.

7. A process as claimed in claim 1, wherein the first precursor gas comprises a hydrocarbon selected form the group consisting of methane, ethane, propane, butane, isobutylene and mixtures thereof.

8. A process as claimed in claim 2, wherein the second precursor gas is selected from the group consisting of boron trichloride, boron tribromide, and diborane.

9. A process as claimed in claim 1, further comprising:

measuring a physical property of the coated substrate relative to a predetermined desired value; and, selectively controlling a rate of flow of the first precursor gas, a transport velocity of the substrate movement, and the temperature of the reaction chamber in response to the measured physical property to control a rate of deposition of the certain of the first species upon the surfaces of the substrate, the coated substrate having a controlled sheet resistance along its length an a substantially uniform sheet resistance along its breadth.

10. A process as claimed in claim 1, wherein the condensed first species comprises an electrically conductive superstrate.

11. A process as claimed in claim 2, wherein both the first precursor gas and the second precursor gas yield condensed first and second species that comprise and electrically conductive superstrate.

12. A process for continuous chemical vapor deposition of a superstrate onto a substrate, comprising:

continuously introducing the substrate, leading end followed by trailing end in a generally vertical direction, along a substrate path through a lower chamber open to atmospheric pressure and having an inlet aperture for introducing the substrate and then upwardly through a generally vertically oriented reaction chamber mounted atop and extending upwardly from the lower chamber, and then into an upper chamber mounted atom and extending upwardly from the reaction chamber, and finally onto a storage roll, the substrate comprising a fibrous refractory material;

introducing at least one precursor gas into the reaction chamber and directing the precursor gas evenly toward the substrate in a downward direction generally opposite to the movement of the substrate along the substrate path;

heating the reaction chamber to a temperature sufficient to pyrolytically dissociate the precursor gas into a plurality of species such as individual atoms and molecular fragments, certain of the species colliding with and evenly condensing on surfaces of the upwardly moving substrate as the substrate is moved through the reaction chamber to form a superstrate coating thereon;

measuring a physical property of the coated substrate relative to a predetermined desired value;

selectively controlling a rate of flow of the precursor gas, a transport velocity of the substrate movement, and the temperature of the reaction chamber in response to the measured physical property to control a rate of deposition of the certain of the species upon the surfaces of the substrate;

continuously withdrawing the coated substrate from the upper chamber onto the storage roll; and introducing an inert gas into the upper chamber at a rate sufficient to prevent air from entering the upper chamber, the inert gas flowing downwardly through the reaction chamber and the lower chamber and preventing air form entering the reaction and lower chambers;

whereby the position process is contained in an open system.

13. A process as claimed in claim 12, further comprising removing reaction by-product gases that reach the lower chamber with exhaust means, without introducing air into the lower chamber.

14. A process as claimed in claim 12, wherein the precursor gas is selected form the group consisting of hydrocarbons and main group halides.

15. A process as claimed in claim 12, wherein the deposited species form a electrically conducive superstrate.

16. A process as claimed in claim 2, wherein an oven encompasses the reaction chamber, operation of the oven producing thermally uniform conditions within the reaction chamber.

17. A process as claimed in claim 2, further comprising:
measuring a physical property of the coated substrate relative to a predetermined desired value; and,
selectively controlling a first rate of flow of the first precursor gas, a second rate of flow of the second precursor gas, a transport velocity of the substrate movement, and the temperature of the reaction chamber in response to the measured physical property to control a rate of deposition of the certain of the first species and the certain of the second species upon the surfaces of the substrate, the coated substrate having a controlled sheet resistance along its length and a substantially uniform sheet resistance along its breadth.

* * * * *

UNITED STATES PATENT AND TRADEMARK OFFICE
CERTIFICATE OF CORRECTION

PATENT NO.  :  5,141,595
DATED       :  25 August 1992
INVENTOR(S) :  Phillip H. Darling, Jr.

It is certified that error appears in the above-identified patent and that said Letters Patent is hereby corrected as shown below:

Column 12, line 8, change "and" to -- an --

Column 12, line 20, change "atom" to -- atop --

Column 12, line 51, change "form" to -- from --

Column 12, line 53, change "position" to -- deposition --

Column 12, line 60, change "form" to --from --

Column 12, line 63, change "conducive" to -- conductive --

Signed and Sealed this

Eighth Day of February, 1994

Attest:

BRUCE LEHMAN

Attesting Officer     Commissioner of Patents and Trademarks